United States Patent
Frankowsky (12)

(10) Patent No.: US 6,902,854 B2
(45) Date of Patent: Jun. 7, 2005

(54) METHOD FOR CARRYING OUT A RULE-BASED OPTICAL PROXIMITY CORRECTION WITH SIMULTANEOUS SCATTER BAR INSERTION

(75) Inventor: Beate Frankowsky, Höhenkirchen-Siegertsbrunn (DE)

(73) Assignee: Infineon Technologies AG, Munich (DE)

( * ) Notice: Subject to any disclaimer, the term of this patent is extended or adjusted under 35 U.S.C. 154(b) by 152 days.

(21) Appl. No.: 10/163,054

(22) Filed: Jun. 5, 2002

(65) Prior Publication Data

US 2002/0182523 A1 Dec. 5, 2002

(30) Foreign Application Priority Data

Jun. 5, 2001 (DE) .......................... 101 27 547

(51) Int. Cl.⁷ ............................. G03F 9/00; G03C 5/00
(52) U.S. Cl. ............................. 430/30; 430/5; 430/296; 430/942
(58) Field of Search ...................... 430/5, 30, 296, 430/942

(56) References Cited

U.S. PATENT DOCUMENTS

| | | | |
|---|---|---|---|
| 5,242,770 A | 9/1993 | Chen et al. | 430/5 |
| 5,885,747 A | 3/1999 | Yamasaki et al. | 430/296 |
| 6,472,108 B1 * | 10/2002 | Lin | 430/5 |
| 6,482,559 B2 * | 11/2002 | Lin | 430/30 |

* cited by examiner

*Primary Examiner*—Christopher G. Young
(74) *Attorney, Agent, or Firm*—Laurence A. Greenberg; Werner H. Stemer; Gregory L. Mayback (57) ABSTRACT

Lithographic fabrication of a microelectronic component is performed with the aid of OPC and a scatter bar structure. At least one scatter bar in applied on a mask in addition to a main structure for the purpose of a subsequent imaging of the main structure from the mask onto a substrate by exposure. At leant one correction value for the OPC is selected in a particular manner in dependence upon a spacing between two parts of the main structure or spacing between neighboring main structures and the presence of a scatter bar between the two parts of the main structure. The manner in which the correction value is defined is determined by so forming an auxiliary quantity for each scatter bar, that the largest auxiliary quantity that is set is less than the smallest spacing between the parts of the main structure, so that in a program for OPC the presence of a scatter bar between the two parts of the main structure is suggested. In this way, correction values for a rule-based OPC method are flexibly defined even in the presence of scatter bars.

25 Claims, 10 Drawing Sheets

Table 1: Correction table OPC per edge [nm], without scatter bars

| Width [μm] \ Spacing [μm] | 0.1600 | 0.1700 | 0.1800 | 0.2000 | 0.2200 | 0.2400 | 0.2600 | 0.3000 | 0.3500 | 0.4000 |
|---|---|---|---|---|---|---|---|---|---|---|
| 0.1600 | -5.0 | -3.0 | -4.0 | -4.0 | -4.5 | -4.5 | -8.5 | -10.5 | -14.0 | -13.5 |
| 0.1700 | 0.0 | -2.0 | -2.5 | -3.0 | -2.5 | -5.0 | -5.5 | -6.0 | -11.0 | -10.5 |
| 0.1800 | 0.5 | 0.5 | 2.0 | 1.5 | -1.0 | 0.0 | -2.5 | -5.0 | -7.5 | -7.5 |
| 0.2000 | 4.0 | 3.5 | 4.0 | 4.0 | 3.0 | 3.0 | 2.5 | -1.0 | -2.5 | -3.0 |
| 0.2200 | 7.0 | 7.0 | 7.5 | 8.0 | 7.0 | 7.0 | 6.5 | 3.5 | 1.5 | 1.0 |
| 0.2400 | 9.0 | 10.0 | 9.0 | 9.5 | 10.0 | 10.0 | 10.0 | 6.5 | 5.0 | 3.0 |
| 0.2600 | 10.5 | 11.0 | 11.0 | 12.0 | 13.0 | 12.5 | 11.0 | 8.0 | 8.0 | 4.5 |
| 0.2800 | 10.5 | 12.0 | 11.0 | 14.0 | 13.5 | 13.0 | 12.0 | 9.0 | 8.0 | 4.0 |
| 0.3000 | 11.0 | 12.0 | 12.0 | 14.5 | 14.0 | 13.5 | 12.5 | 9.0 | 6.5 | 4.0 |
| 0.3200 | 11.5 | 12.0 | 13.0 | 14.0 | 14.5 | 14.0 | 13.0 | 8.5 | 4.5 | 3.0 |
| 0.3500 | 12.5 | 13.5 | 14.0 | 15.5 | 16.0 | 16.0 | 14.0 | 9.5 | 5.0 | 2.5 |
| 0.4000 | 16.5 | 17.5 | 18.5 | 19.0 | 18.5 | 17.5 | 15.0 | 10.0 | 4.5 | 3.0 |
| 0.4200 | 18.0 | 18.5 | 20.0 | 20.0 | 19.0 | 18.0 | 15.0 | 10.0 | 6.0 | 3.0 |
| 0.4300 | 19.0 | 20.0 | 20.0 | 20.0 | 19.0 | 17.0 | 16.0 | 10.0 | 5.0 | 4.0 |
| 0.4350 | 19.0 | 20.0 | 21.0 | 21.0 | 19.5 | 17.0 | 15.5 | 10.0 | 5.0 | 4.0 |
| 0.4400 | 19.0 | 19.0 | 21.0 | 20.5 | 19.0 | 18.0 | 15.0 | 9.5 | 6.0 | 3.5 |
| 0.4500 | 19.5 | 20.0 | 20.0 | 19.5 | 19.0 | 17.0 | 16.0 | 10.0 | 5.0 | 3.5 |
| 0.4600 | 19.0 | 19.5 | 21.0 | 20.0 | 19.5 | 17.0 | 15.0 | 9.0 | 5.5 | 4.0 |
| 0.4800 | 19.0 | 19.5 | 20.0 | 20.0 | 19.0 | 16.0 | 14.5 | 9.0 | 4.5 | 3.0 |
| 0.5000 | 18.5 | 19.0 | 18.5 | 19.0 | 17.0 | 15.5 | 13.0 | 7.5 | 3.5 | 2.5 |
| 0.5500 | 14.5 | 15.0 | 15.5 | 15.0 | 14.5 | 12.5 | 11.5 | 6.0 | 0.5 | -2.5 |
| 0.5800 | 13.0 | 13.5 | 14.0 | 13.0 | 12.5 | 12.0 | 8.5 | 4.0 | -1.0 | -4.0 |
| 0.5900 | 13.0 | 13.0 | 13.0 | 13.0 | 12.0 | 10.0 | 8.0 | 3.0 | -2.0 | -4.5 |
| 0.6000 | 13.0 | 13.0 | 13.0 | 13.0 | 11.5 | 10.0 | 8.5 | 3.5 | -2.5 | -5.0 |
| 0.6100 | 13.0 | 12.5 | 13.0 | 12.0 | 12.0 | 9.5 | 7.5 | 2.5 | -2.5 | -6.0 |
| 0.6200 | 12.0 | 12.0 | 11.5 | 12.0 | 11.0 | 9.5 | 6.0 | 2.5 | -3.0 | -5.5 |
| 0.6300 | 11.5 | 11.0 | 11.0 | 11.5 | 11.0 | 9.0 | 6.5 | 2.0 | -3.5 | -5.5 |
| 0.6400 | 11.0 | 11.5 | 11.5 | 12.0 | 10.5 | 9.5 | 7.0 | 1.5 | -3.5 | -5.5 |
| 0.6500 | 11.0 | 11.0 | 11.0 | 11.0 | 10.5 | 9.0 | 7.0 | 1.5 | -4.0 | -6.0 |
| 0.6600 | 11.0 | 11.0 | 11.0 | 12.0 | 10.0 | 8.5 | 8.0 | 1.5 | -4.0 | -6.5 |
| 0.6700 | 10.5 | 11.0 | 11.0 | 11.0 | 10.0 | 8.0 | 8.0 | 1.0 | -4.0 | -6.5 |
| 0.6800 | 10.5 | 11.0 | 10.0 | 10.0 | 10.0 | 8.0 | 8.0 | 1.5 | -4.0 | -6.5 |
| 0.6900 | 10.0 | 11.0 | 11.0 | 10.0 | 10.0 | 8.0 | 8.0 | 0.5 | -4.5 | -7.0 |
| 0.7000 | 10.5 | 10.0 | 10.0 | 10.0 | 9.0 | 7.5 | 6.0 | 0.0 | -5.0 | -7.5 |
| 0.7100 | 9.5 | 9.5 | 10.0 | 10.0 | 9.0 | 7.5 | 5.0 | 0.0 | -5.5 | -7.5 |
| 0.7200 | 9.5 | 9.0 | 10.0 | 9.0 | 8.0 | 7.0 | 4.5 | 0.5 | -5.0 | -7.5 |
| 0.7500 | 9.0 | 8.0 | 9.5 | 8.0 | 7.0 | 6.0 | 4.0 | -0.5 | -6.0 | -8.5 |
| 0.8000 | 7.5 | 7.0 | 7.0 | 7.0 | 6.0 | 4.5 | 2.0 | -2.5 | -8.0 | -11.0 |
| 0.8500 | 6.5 | 6.0 | 6.0 | 6.0 | 4.5 | 3.0 | 1.0 | -3.0 | -9.5 | -12.0 |
| 0.9000 | 5.5 | 5.0 | 6.0 | 5.0 | 4.0 | 2.5 | 0.5 | -3.5 | -9.5 | -12.5 |
| 0.9200 | 5.0 | 5.5 | 4.5 | 4.0 | 4.0 | 3.0 | 1.5 | -4.0 | -10.0 | -13.0 |
| 0.9400 | 5.0 | 5.0 | 5.0 | 4.0 | 3.5 | 2.0 | 1.0 | -4.0 | -10.5 | -12.5 |
| 0.9500 | 5.0 | 4.5 | 5.0 | 4.5 | 4.0 | 2.0 | 0.5 | -4.5 | -9.5 | -14.0 |
| 0.9600 | 5.0 | 5.0 | 4.0 | 4.0 | 3.5 | 2.5 | 1.0 | -4.5 | -10.5 | -13.5 |
| 0.9700 | 5.0 | 4.5 | 4.0 | 4.0 | 3.5 | 2.0 | 0.0 | -5.0 | -10.5 | -13.5 |
| 0.9800 | 4.5 | 4.0 | 4.0 | 4.0 | 3.0 | 2.0 | 0.0 | -4.5 | -10.0 | -14.0 |
| 1.0000 | 4.0 | 4.0 | 3.5 | 4.0 | 4.0 | 2.0 | 0.5 | -5.0 | -10.5 | -14.0 |
| 1.0500 | 4.0 | 4.0 | 3.0 | 3.0 | 2.0 | 1.5 | 0.0 | -5.5 | -11.5 | -14.5 |
| 1.1000 | 3.5 | 3.5 | 3.0 | 2.0 | 2.0 | 1.0 | -0.5 | -6.5 | -11.5 | -16.0 |
| 1.1500 | 3.5 | 2.5 | 2.5 | 2.5 | 1.0 | 1.0 | -1.5 | -6.0 | -13.0 | -16.5 |
| 1.1800 | 3.0 | 2.5 | 2.5 | 2.0 | 2.0 | 0.0 | -1.5 | -6.0 | -13.0 | -15.5 |
| 1.1900 | 3.5 | 2.5 | 2.5 | 2.0 | 1.0 | 0.0 | -1.5 | -6.5 | -12.0 | -16.0 |
| 1.2000 | 3.0 | 2.0 | 2.0 | 2.0 | 0.5 | 0.5 | -2.0 | -6.5 | -12.5 | -15.5 |
| 1.2100 | 3.0 | 2.5 | 2.0 | 1.0 | 1.0 | -0.5 | -2.0 | -7.0 | -13.0 | -16.0 |
| 1.2200 | 2.5 | 2.0 | 2.0 | 2.0 | 1.0 | -1.0 | -2.0 | -7.0 | -12.5 | -17.0 |
| 1.2500 | 2.5 | 2.0 | 1.5 | 1.0 | 0.5 | -1.0 | -2.0 | -7.5 | -12.5 | -17.0 |
| 1.3000 | 2.5 | 2.0 | 2.0 | 1.0 | 0.5 | -1.0 | -3.0 | -7.5 | -13.5 | -16.5 |
| 1.3500 | 2.0 | 1.5 | 2.0 | 1.0 | 0.5 | -1.0 | -3.0 | -7.5 | -13.5 | -18.0 |
| 1.4000 | 2.0 | 1.5 | 1.0 | 1.0 | 0.5 | -2.0 | -3.0 | -8.0 | -13.0 | -17.0 |
| 1.5000 | 1.5 | 1.0 | 0.5 | 0.0 | -0.5 | -1.0 | -3.0 | -8.5 | -14.0 | -17.0 |
| 1.6000 | 1.5 | 0.5 | 1.0 | 1.0 | 0.0 | -1.0 | -3.0 | -8.0 | -14.0 | -18.0 |
| 1.8000 | 1.5 | 0.5 | 1.0 | 1.0 | 0.0 | -1.0 | -3.0 | -8.0 | -14.0 | -18.0 |
| 2.0000 | 1.5 | 0.5 | 1.0 | 1.0 | 0.0 | -1.0 | -3.0 | -8.0 | -14.0 | -18.0 |
| 3.0000 | 1.5 | 0.5 | 1.0 | 1.0 | 0.0 | -1.0 | -3.0 | -8.0 | -14.0 | -18.0 |
| 5.0000 | 1.5 | 0.5 | 1.0 | 1.0 | 0.0 | -1.0 | -3.0 | -8.0 | -14.0 | -18.0 |

FIG. 7

Table 2: Correction table OPC per edge [nm], with scatter bars
Spacing [μm]

| Width [μm] | 0.1600 | 0.1700 | 0.1800 | 0.2000 | 0.2200 | 0.2400 | 0.2500 | 0.3000 | 0.3500 | 0.4000 |
|---|---|---|---|---|---|---|---|---|---|---|
| 0.1600 | -5.0 | -3.0 | -4.0 | -4.0 | -4.5 | -4.5 | -6.5 | -10.5 | -14.0 | -13.5 |
| 0.1700 | 0.0 | -2.0 | -2.5 | -3.0 | -2.5 | -5.0 | -5.5 | -8.0 | -11.0 | -10.5 |
| 0.1800 | 0.5 | 0.5 | 2.0 | 1.5 | -1.0 | 0.0 | -2.5 | -5.0 | -7.5 | -7.5 |
| 0.2000 | 4.0 | 3.5 | 4.0 | 4.0 | 3.0 | 3.0 | 2.5 | -1.0 | -2.5 | -3.0 |
| 0.2200 | 7.0 | 7.0 | 7.5 | 8.0 | 7.0 | 7.0 | 6.5 | 3.5 | 1.5 | 1.0 |
| 0.2400 | 9.0 | 10.0 | 9.0 | 9.5 | 10.0 | 10.0 | 10.0 | 6.5 | 5.0 | 3.0 |
| 0.2600 | 10.5 | 11.0 | 11.0 | 12.0 | 13.0 | 12.5 | 11.0 | 8.0 | 6.0 | 4.5 |
| 0.2800 | 10.5 | 12.0 | 11.0 | 14.0 | 13.5 | 13.0 | 12.0 | 9.0 | 6.0 | 4.0 |
| 0.3000 | 11.0 | 12.0 | 12.0 | 14.5 | 14.0 | 13.5 | 12.5 | 9.0 | 5.5 | 4.0 |
| 0.3200 | 11.5 | 12.0 | 13.0 | 14.0 | 14.5 | 14.0 | 13.0 | 8.5 | 4.5 | 3.0 |
| 0.3500 | 12.5 | 13.5 | 14.0 | 15.5 | 16.0 | 16.0 | 14.0 | 9.5 | 5.0 | 2.5 |
| 0.4000 | 16.5 | 17.5 | 18.5 | 19.0 | 19.0 | 17.5 | 15.0 | 10.0 | 4.5 | 3.0 |
| 0.4200 | 18.0 | 18.5 | 20.0 | 20.0 | 19.0 | 18.0 | 15.0 | 10.0 | 6.0 | 3.0 |
| 0.4300 | 19.0 | 20.0 | 20.0 | 20.0 | 18.0 | 17.0 | 15.0 | 10.0 | 5.0 | 4.0 |
| 0.4350 | 18.0 | 20.0 | 21.0 | 21.0 | 18.5 | 17.0 | 15.5 | 10.0 | 5.0 | 4.0 |
| 0.4400 | 7.0 | 10.0 | 8.0 | 10.0 | 9.5 | 8.0 | 7.5 | 6.5 | -3.5 | -5.5 |
| 0.4500 | 9.5 | 9.5 | 12.0 | 11.5 | 11.5 | 9.5 | 8.5 | 2.5 | -3.5 | -4.5 |
| 0.4600 | 10.5 | 12.5 | 12.0 | 14.0 | 13.0 | 10.5 | 9.5 | 2.5 | -1.0 | -2.5 |
| 0.4800 | 13.0 | 14.0 | 15.0 | 16.0 | 14.0 | 12.0 | 10.0 | 4.0 | -0.5 | -1.0 |
| 0.5000 | 14.0 | 15.0 | 16.5 | 16.0 | 14.5 | 13.5 | 10.5 | 5.5 | 1.0 | -0.5 |
| 0.5500 | 14.5 | 16.0 | 16.5 | 17.0 | 16.0 | 12.5 | 10.5 | 4.5 | 1.0 | -0.5 |
| 0.5600 | 14.0 | 15.0 | 15.0 | 14.0 | 12.5 | 11.5 | 8.0 | 4.0 | -0.5 | -2.5 |
| 0.5700 | 14.0 | 14.0 | 15.0 | 13.5 | 12.0 | 10.0 | 8.0 | 3.5 | -0.5 | -2.5 |
| 0.5800 | 13.5 | 14.0 | 13.5 | 13.0 | 11.0 | 10.0 | 8.0 | 3.0 | -1.0 | -3.5 |
| 0.6100 | 13.0 | 13.5 | 13.0 | 12.0 | 12.0 | 9.5 | 7.5 | 3.0 | -1.0 | -3.5 |
| 0.6200 | 13.0 | 13.0 | 11.5 | 12.0 | 11.0 | 9.5 | 7.5 | 2.5 | -1.5 | -4.0 |
| 0.6300 | 12.0 | 11.0 | 12.0 | 11.5 | 10.5 | 9.0 | 6.0 | 2.5 | -2.5 | -4.5 |
| 0.6400 | 11.5 | 12.0 | 11.0 | 12.0 | 10.5 | 8.5 | 7.0 | 1.5 | -2.0 | -4.0 |
| 0.6500 | 11.0 | 11.0 | 11.5 | 11.0 | 9.5 | 8.0 | 6.0 | 2.5 | -2.5 | -5.5 |
| 0.6600 | 10.5 | 10.5 | 11.0 | 11.0 | 10.0 | 8.0 | 6.5 | 1.5 | -2.5 | -6.5 |
| 0.6700 | 10.5 | 10.5 | 11.0 | 10.0 | 8.5 | 8.0 | 6.0 | 1.5 | -3.0 | -6.0 |
| 0.6800 | 11.0 | 10.5 | 11.0 | 10.0 | 9.5 | 7.5 | 5.0 | 1.5 | -3.5 | -6.0 |
| 0.7000 | 2.5 | 5.0 | 4.0 | 7.0 | 7.5 | 6.5 | 4.0 | -3.5 | -8.0 | -11.5 |
| 0.7050 | 3.5 | 3.5 | 7.0 | 7.0 | 7.5 | 6.5 | 3.5 | -2.5 | -8.0 | -11.0 |
| 0.7100 | 4.0 | 6.0 | 4.5 | 7.0 | 7.0 | 5.5 | 5.0 | -3.0 | -8.0 | -10.5 |
| 0.7250 | 5.0 | 4.5 | 7.5 | 7.5 | 7.0 | 6.0 | 2.0 | -2.5 | -8.5 | -11.5 |
| 0.7500 | 4.0 | 5.0 | 4.5 | 8.5 | 7.5 | 5.5 | 2.0 | -3.5 | -8.5 | -12.0 |
| 0.8000 | 1.0 | 2.0 | 0.5 | 2.0 | 2.0 | 0.5 | 0.0 | -4.0 | -11.5 | -14.5 |
| 0.8500 | -2.0 | -1.5 | -1.0 | 0.5 | -1.0 | -2.0 | -2.5 | -6.0 | -14.0 | -17.0 |
| 0.9000 | -3.0 | -2.5 | 0.0 | -1.5 | -0.5 | -3.0 | -3.0 | -8.0 | -15.0 | -18.0 |
| 0.9200 | -2.5 | -3.0 | -3.5 | -0.5 | -1.0 | -0.5 | -3.0 | -8.0 | -14.5 | -18.0 |
| 0.9400 | 1.5 | 1.5 | 4.0 | 3.5 | 4.0 | 3.0 | 1.5 | -4.5 | -11.0 | -13.5 |
| 0.9500 | 2.0 | 2.5 | 4.5 | 5.0 | 7.0 | 3.0 | 1.5 | -4.5 | -10.5 | -13.0 |
| 0.9600 | 2.0 | 4.0 | 2.5 | 5.0 | 6.5 | 5.0 | 3.0 | -4.5 | -10.5 | -13.5 |
| 0.9700 | 2.5 | 3.0 | 2.5 | 6.0 | 4.5 | 5.0 | 2.5 | -4.0 | -10.5 | -12.5 |
| 0.9800 | 2.5 | 2.5 | 4.5 | 8.0 | 4.5 | 5.0 | 1.5 | -4.5 | -10.5 | -12.5 |
| 1.0000 | 2.5 | 4.5 | 4.5 | 8.0 | 7.0 | 4.0 | 2.0 | -4.0 | -10.0 | -13.0 |
| 1.0500 | 2.0 | 4.0 | 2.5 | 5.0 | 4.5 | 3.5 | 1.0 | -5.5 | -11.0 | -14.0 |
| 1.1000 | 0.5 | 2.0 | 0.0 | 2.5 | 1.5 | 1.0 | -1.5 | -7.0 | -12.5 | -14.5 |
| 1.1500 | -1.0 | -0.5 | -2.0 | 0.5 | -0.5 | 0.0 | -3.0 | -7.5 | -13.5 | -17.0 |
| 1.1600 | -2.0 | -1.5 | -1.5 | -0.5 | 1.0 | -1.5 | -3.0 | -8.0 | -14.5 | -18.0 |
| 1.1800 | 1.5 | 2.5 | 1.5 | 4.5 | 4.0 | 4.0 | 1.5 | -5.0 | -11.5 | -13.5 |
| 1.2000 | 0.5 | 1.0 | 2.0 | 4.0 | 3.5 | 4.0 | 1.5 | -5.0 | -11.5 | -14.0 |
| 1.2100 | 1.5 | 1.5 | 4.0 | 3.0 | 4.0 | 2.0 | 0.5 | -6.0 | -12.0 | -14.0 |
| 1.2200 | 1.5 | 1.5 | 3.5 | 4.5 | 5.5 | 2.0 | 1.0 | -5.0 | -11.5 | -14.0 |
| 1.2500 | 0.0 | 0.5 | 2.0 | 2.5 | 3.0 | 2.5 | 0.0 | -5.5 | -11.5 | -13.5 |
| 1.3000 | -0.5 | -0.5 | 1.5 | 1.0 | 1.0 | 0.5 | -1.0 | -6.0 | -13.0 | -16.0 |
| 1.3500 | -2.0 | -2.0 | 1.0 | 0.5 | 1.0 | -1.0 | -1.5 | -7.5 | -14.5 | -16.5 |
| 1.4000 | -2.0 | -2.0 | -0.5 | 0.5 | 2.0 | -1.5 | -2.0 | -8.0 | -14.0 | -17.5 |
| 1.5000 | -3.5 | -3.0 | -3.0 | -1.0 | -0.5 | 0.0 | -2.5 | -8.5 | -14.5 | -18.0 |
| 1.6000 | -5.0 | -4.0 | -3.5 | -1.5 | -1.5 | -0.5 | -4.0 | -8.0 | -15.5 | -19.0 |
| 1.8000 | -5.0 | -5.5 | -3.0 | -3.5 | -2.0 | -3.5 | -4.5 | -9.0 | -15.5 | -19.5 |
| 2.0000 | -5.5 | -5.0 | -5.5 | -2.0 | -3.0 | -2.0 | -4.5 | -10.0 | -15.5 | -19.5 |
| 3.0000 | -6.5 | -6.0 | -4.0 | -3.0 | -1.5 | -2.0 | -4.0 | -9.5 | -16.5 | -20.0 |
| 5.0000 | -5.5 | -6.0 | -4.0 | -3.0 | -1.5 | -2.0 | -4.0 | -9.5 | -16.5 | -20.0 |

FIG. 8

Table 3: Correction table OPC per edge [nm], common table, scatter bars merged tables sb-Nosb, sb used as proxy

METHOD FOR CARRYING OUT A RULE-BASED OPTICAL PROXIMITY CORRECTION WITH SIMULTANEOUS SCATTER BAR INSERTION

BACKGROUND OF THE INVENTION

Field of the Invention

The invention relates to a method for carrying out a rule-based OPC (optical proximity correction) with simultaneous scatter bar insertion.

In lithographic methods for fabricating structures of microelectronic components with the aid of projection exposure, ever finer structures must be generated on substrates.

The wavelengths utilized in projection exposure today are larger than the smallest dimensions of the structures to be generated on the substrate. Therefore, diffraction effects play a large role in the imaging of the structures. They effectuate a flattening of the intensity gradients at the edge of a structure by scattering light in the exposing of closely adjoining structures.

The emerging edge unsharpnesses and consequent dimensional distortions are principally dependent on the relative proximity of the structures on the substrate, the light wavelength, and the numerical aperture of the exposure device. Thus, two structures with the same dimensions will have different dimensions after exposure in one and the same exposure process (i.e. the same wavelength and numerical aperture), depending on how close these structures are to other parts of the exposed layout. This change of the dimensional relations in dependence on the relative proximity of the structures is called proximity effect.

A known technique for alleviating proximity effects is to carry out an optical proximity correction of the structure (OPC) before the mask is created. An OPC is carried out in order to guarantee that the finished structures on the substrate are actually the sizes provided in the layout. This cannot be assumed because size changes can occur during the fabrication of a microelectronic component (for instance due to the proximity effect). These are compensated by the OPC.

The OPC can be carried out by means of a simulation program or a rule-based software system. Utilizing simulation programs requires a substantial computing outlay, which is smaller given the application of rules for generating the correction of the structure. In rule-based OPC, a correction value is tabulated in dependence upon the dimension of parts of the structure (e.g. the width) and in dependence upon the spacing between two parts of a structure or spacing in between neighboring structures, and this value is utilized for correcting the layout data. The mask is created from this. Rule-based OPCs are preferred owing to the lower computing outlay.

U.S. Pat. No. 5,242,770 describes attaching thin lines between the structures in order to improve the sharpness of the imaging in lithography. These lines are so thin that they are not imaged on the substrate themselves. These lines, known as scatter bars, influence the intensity gradients at the edges of the structures, so that differences between tightly packed parts of the structure and more widely spaced parts of the structures are balanced out. The scatter bars are arranged parallel to parts of the structure at predeterminable intervals.

In general, semiconductor layouts are created with the aid of computer programs. In a prior art method, a series of data sets are formed in the course of the creation process. These data sets are referred to as layers and contain structures. The structures of one or more layers are written onto a mask, which are imaged onto a substrate by exposure (main structures). As explained above, the mask also contains scatter bars, which cannot be imaged onto the substrate by exposure owing to their small dimensions. But they support the imaging of the main structures.

In simulation-based OPC, scatter bars are taken into consideration as a proximity layer. The proximity layer basically represents structures which are taken into consideration in the correction of the main structure but which cannot be corrected themselves. For instance, the proximity layer can represent scatter bars between the main structures. When the main structure is subsequently subjected to simulation-based OPC, the positions of the scatter bars are also taken into account, but a correction (by simulation-based OPC) is only carried out at the main structure.

It would be desirable to subject the layer that is to be corrected to a rule-based OPC instead of a simulation-based OPC, because the computing outlay is very large for simulation-based OPCs owing to the increasing miniaturization of structures.

In rule-based OPC, the correction that is to be calculated depends on the spacings between parts of the main structure or the spacing between neighboring main structures. The problem is knowing whether a scatter bar is located in the interval between two main structures or in the interval between two parts of the main structure. But this is complicated by the fact that when scatter bars are generated, many need to be removed again, for instance because they cross other scatter bars. Given crossovers, larger structures could otherwise be generated on the mask from the thin lines of the scatter bars, which structures could be imaged onto the substrate by exposure. This is to be avoided.

If, then, the scatter bars were considered as proximity layers in a rule-based OPC, it would be necessary to distinguish between measured intervals between two parts of the main structure and those between a part of the main structure and a scatter bar, because in rule-based OPC the defining of a specific correction value depends on this. Without such discrimination, it would be impossible to provide unambiguous correction values.

The combination of a rule-based OPC method and scatter bars is thus not viable without further ado.

SUMMARY OF THE INVENTION

It is accordingly an object of the invention to provide a method of implementing rule-based OPC and simultaneous use of scatter bars, which overcomes the above-mentioned disadvantages of the heretofore-known devices and methods of this general type and which provides for a method with which correction values for a rule-based OPC method can be flexibly defined even in the presence of scatter bars.

With the foregoing and other objects in view there is provided, in accordance with the invention, a method for the lithographic fabrication of a microelectronic component with optical proximity correction, which comprises:

imaging a main structure with an auxiliary structure onto a substrate by exposing;

selecting at least one correction value for an optical proximity correction in dependence upon a spacing between two parts of the main structure or a spacing between neighboring main structures and a presence of the auxiliary structure between the two parts of the main structure;

forming an auxiliary quantity for the auxiliary structure for the purpose of determining a manner wherein the correction value is specified, and thereby setting a largest auxiliary quantity to be smaller than a smallest spacing between the parts of the main structure or a spacing between neighboring main structures; and concluding with a program for the optical proximity correction whether the auxiliary structure is present between two parts of the main structure or a spacing between neighboring main structures.

In accordance with an added feature of the invention, the main structure and the auxiliary structure are applied on a mask for a subsequent imaging of the main structure from the mask onto the substrate.

In accordance with an additional feature of the invention, the auxiliary quantity is set as a virtual modification in a layer that is separate from a layer utilized for fabricating the mask.

In accordance with another feature of the invention, the auxiliary structure is at least one scatter bar. Preferably, the auxiliary quantity is set by a virtual expansion or reduction of at least one scatter bar. It is also possible to set the auxiliary quantity by a virtual offset from a real position of at least one scatter bar.

In accordance with a further feature of the invention, the auxiliary quantity is set in a proximity layer.

In accordance with again an added feature of the invention, the OPC correction values of a first region of a layout with scatter bars and a second region of a layout without scatter bars are stored in a single table for use in a program. Preferably, an amount of the largest auxiliary quantity is used as a criterion for discriminating between the first and second regions.

There is also provided, in accordance with the invention, a method of designing a layout of a microelectronic component, which comprises the following steps:

defining a main structure of the microelectronic component including a plurality of microelectronic elements separated by first spacings;

defining a first auxiliary structure formed of one or more auxiliary elements that are respectively separated from one of the microelectronic elements by a respective second spacing;

defining a second auxiliary structure based on the first auxiliary structure by modifying the second spacings; and performing a rule-based optical proximity correction based on the main structure and the second auxiliary structure.

With the above and other objects in view there is also provided, in accordance with the invention, a method of fabricating a microelectronic component, which comprises the following steps:

designing a layout of the microelectronic component with the above-outlined method;

fabricating a mask containing the main structure corrected with the optical proximity correction and the first auxiliary structure, but not the second auxiliary structure; and exposing the mask for imaging the main structure onto a substrate.

There is also provided, in accordance with the invention, a program for processing the above-outlined method on a data processing system, i.e., a computer-readable medium having stored thereon computer-executable instructions for carrying out the method on a data processing system.

With the above and other objects in view there is also provided, in accordance with the invention, a data processing system for defining data representing a layout of a microelectronic component, comprising:

means for defining data representing a main structure of the microelectronic component containing a number of microelectronic elements separated by first spacings;

means for defining data representing a first auxiliary structure containing one or more auxiliary elements respectively separated from one of the microelectronic elements by a second spacing;

means for defining data representing a second auxiliary structure by adapting the data representing the auxiliary elements by modifying the second spacings; and means for carrying out an optical proximity correction with the data representing the main structure and the second auxiliary structure.

According to the invention, a method is created for lithographically fabricating a microelectronic component with the aid of an OPC, whereby a main structure (GC) is imaged onto a substrate by exposure with the aid of an auxiliary structure; whereby at least one correction value is selected for the OPC in a particular manner in dependence upon a spacing between two parts of the main structure or a spacing between neighboring main structures (GC) and the presence of the auxiliary structure between the two parts of the main structure or between neighboring main structures; whereby the manner wherein a correction value is defined is determined by forming an auxiliary quantity for the auxiliary structure, whereby the largest auxiliary quantity is set so that it is smaller than the smallest spacing (FS) between the parts of the main structure or a spacing between neighboring main structures (GC), and thus a program for OPC the presence of the auxiliary structure between the two parts of the main structure or between neighboring main structures is suggested.

In a development, the main structure (GC) and the auxiliary structure are applied on a mask for a subsequent imaging of the main structure from the mask onto a substrate. The auxiliary structure is formed by at least one scatter bar.

Advantageously, the auxiliary quantity is set by expanding or reducing at least one scatter bar. The expansion can be easily realized with conventional program tools.

Alternatively, the auxiliary quantity can be set by a combination of both an offset from the real position of at least one scatter bar and by expanding or reducing at least one scatter bar.

It is likewise advantageous when the auxiliary quantity is set by an offset from the real position of at least one scatter bar.

A particularly advantageous embodiment of the inventive method provides that the first spacing is set by a virtual modification in a layer which is separate from the layer that is utilized for the fabrication of the mask. The correction values for the OPC can be calculated particularly easily this way.

The correction values for regions of a layout which include scatter bars and regions of a layout without scatter bars are advantageously stored in a single table for use in a program. This makes possible a particularly simple utilization in a program, because the correction values for regions with scatter bars and the correction values for regions without scatter bars can be distinguished solely on the basis of the auxiliary quantity.

Advantageously, at least one scatter bar exhibits the shape of a rectangle of predeterminable width, which is arranged parallel to a part of the main structure. Such a scatter bar can be easily arranged next to a part of the main structure.

It is likewise advantageous when at least one scatter bar has the shape of a polygon of adjustable width, which is arranged parallel to a part of the main structure. The polygon can extend along longer parts of the main structure.

The invention also provides a method for designing the layout of a microelectronic component with the following steps: define a main structure of the microelectronic component with a plurality of microelectronic elements separated by first spacings; define a first auxiliary structure consisting of one or more auxiliary elements that are separated from one of the microelectronic elements by a respective second spacing; define a second auxiliary structure on the basis of the first auxiliary structure by modifying the second spacings; perform a rule-based OPC on the basis of the main structure and the second auxiliary structure.

Besides this, a data processing system is provided for specifying data representing the layout of a microelectronic component, with a means for specifying data which represent a main structure of the microelectronic component, whereby the microelectronic component contains a plurality of microelectronic elements separated by first spacings; a means for specifying data representing a first auxiliary structure, which contain one or more auxiliary elements which are separated from one of the microelectronic elements by a respective second spacing; a means for specifying data representing a second auxiliary structure by adapting the data representing the auxiliary elements by modifying the second spacings; and means for carrying out an OPC by means of the data representing the main structure and the second auxiliary structure.

In accordance with a concomitant feature of the invention, the optical proximity correction is a line-bias based OPC, a hammerhead based OPC, or a serif based OPC.

Other features which are considered as characteristic for the invention are set forth in the appended claims.

Although the invention is illustrated and described herein as embodied in a method for carrying out a rule-based OPC with simultaneous scatter bar insertion, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
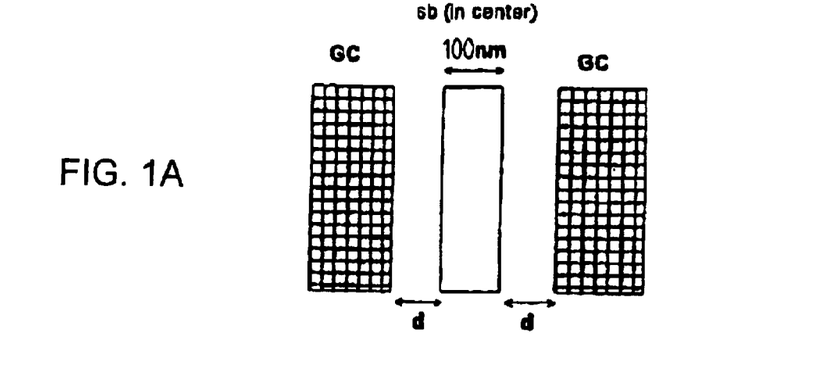
FIGS. 1A to 1D are diagrammatic illustrations of rules for arranging scatter bars between parts of a main structure of a layout for a semiconductor element.
Figure 1B:
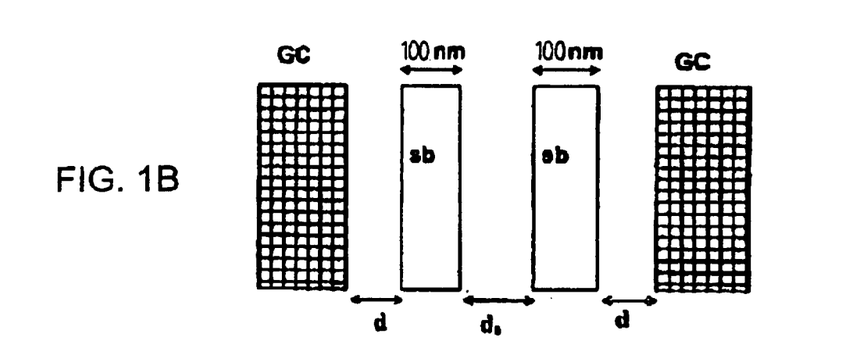
Figure 1C:
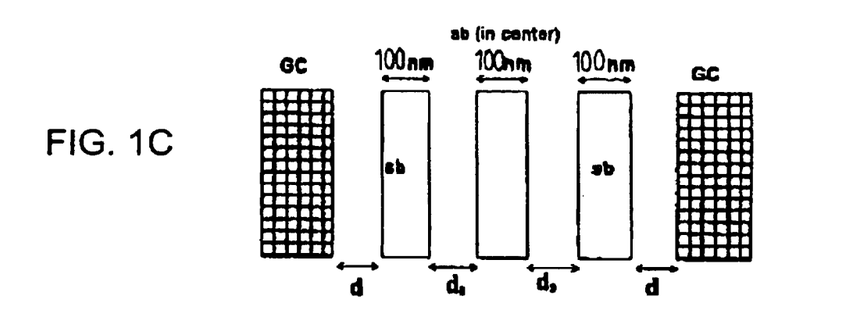
Figure 1D:
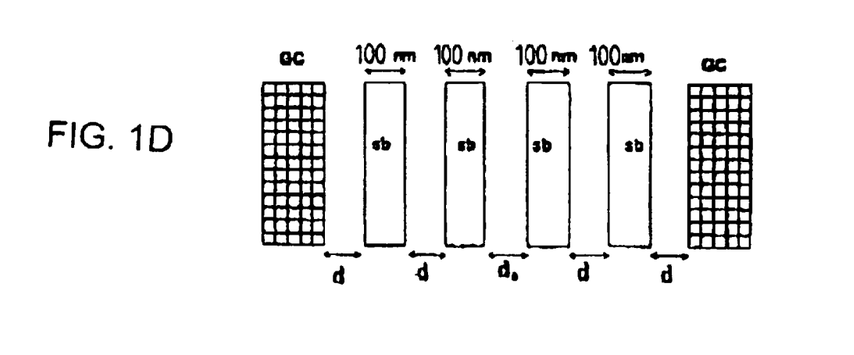
Figure 2:
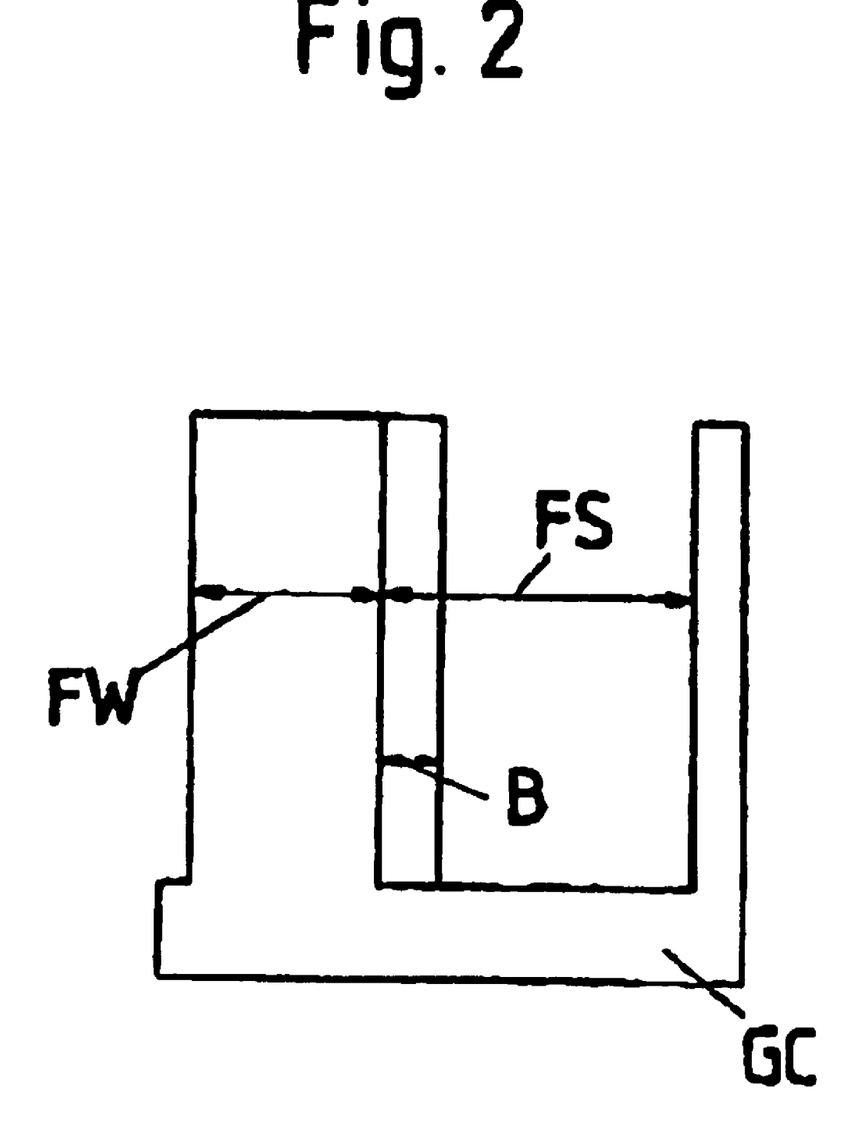
FIG. 2 is a schematic representation of a bias in an optical proximity correction (OPC)

Referring now to the figures of the drawing in detail and first, particularly, to FIGS. 1 and 2 thereof, there are shown the rules for generating scatter bars in the partial FIGS. 1A–1D, and how a rule-based OPC is carried out in FIG. 2, whereby OPC on principle is basically also applied without utilizing scatter bars. These two figures serve primarily to describe the technical background of the invention.

FIGS. 1A–1D represent the rules according to which scatter bars (sb) are arranged between parts of a main structure (GC) in one embodiment.

The spacing between a part of the main structure GC and a scatter bar is hereinafter referenced spacing d. The interval between two parts of the main structure or two neighboring main structures is referred to as the second spacing (FS; Feature Spacing).

If the second spacing between parts of the main structure or between neighboring main structures is less than 440 nm, scatter bars are not used.

FIG. 1A represents the situation where the second spacing FS between the main structures is greater than or equal to 440 nm but less than 690 nm. A scatter bar sb with a width of 100 nm is then set between the main structures GC. The first spacing d with respect to the main structures is between 170 nm and 295 nm.

The arrangement of two, three and four scatter bars is accomplished analogously, this being represented in FIGS. 1B–d. The following measurement specifications apply:

FIG. 1B: arrangement of two scatter bars when the second spacing between main structures GC equals 690 nm$\leq$FS<940 nm;

Spacing $d_s$ between the scatter bars: 150 nm$\leq d_s \leq$400 nm.

The first spacing d between the main structure and a scatter bar: 170 nm.

FIG. 1C: arrangement of three scatter bars sb, when the second spacing between parts of the main structures GC is 940 nm$\leq$FS<1190 nm:

Spacing $d_s$ between the scatter bars sb: 150 nm$\leq d_s \leq$275 nm.

The first spacing d between the main structure and the scatter bar: 170 nm.

FIG. 1D: arrangement of four scatter bars Sb, when the second spacing between main structures GC is 1200 nm$\leq$FS<$\infty$:

Spacing $d_s$ between the scatter bars sb: 150 nm$\leq d_s \leq \infty$.

First spacing d between the main structure and scatter bar: 170 nm.

In principle, the distances between the scatter bars can be different. The distances between scatter bars and parts of the main structure can also vary.

FIG. 2 represents the set-up of rules for OPC with the aid of the line bias. All edges of the entire main structure are examined by means of a computer program. The edge is shifted by the bias B according to specified correction values in dependence on the width FW (feature width) and the second spacing (feature spacing) to the next relevant part of the main structure or the nearest edge of a neighboring main structure. A positive bias B means that an outward shift occurs; the part of the main structure then becomes wider. A negative bias B means that an inward shift occurs, and the part of the main structure becomes narrower.

Thus the selection of specified correction values depends on the measured distances between parts of the main structure. This main structure is defined in an input layer in the programs.

In a known program, what is known as a proximity layer can also be defined, whose structures are considered the nearest neighbor in the distance measuring operation but whose structures are not themselves corrected; i.e., the correction values are not applied to structures of the proximity layer. These proximity layers are usually layers which are written on the same mask as the layer that is to be corrected but which are themselves not critical or not to be corrected.

Examples of prescribed correction values will now be described.

Table 1 (FIG. 7) is a correction table for the case when scatter bars are not utilized. In the left-hand column is the second spacing FS between the parts of the main structure, in micrometers. In the top row is the width FW of the examined main structure GC, also in micrometers.

Figure 7:
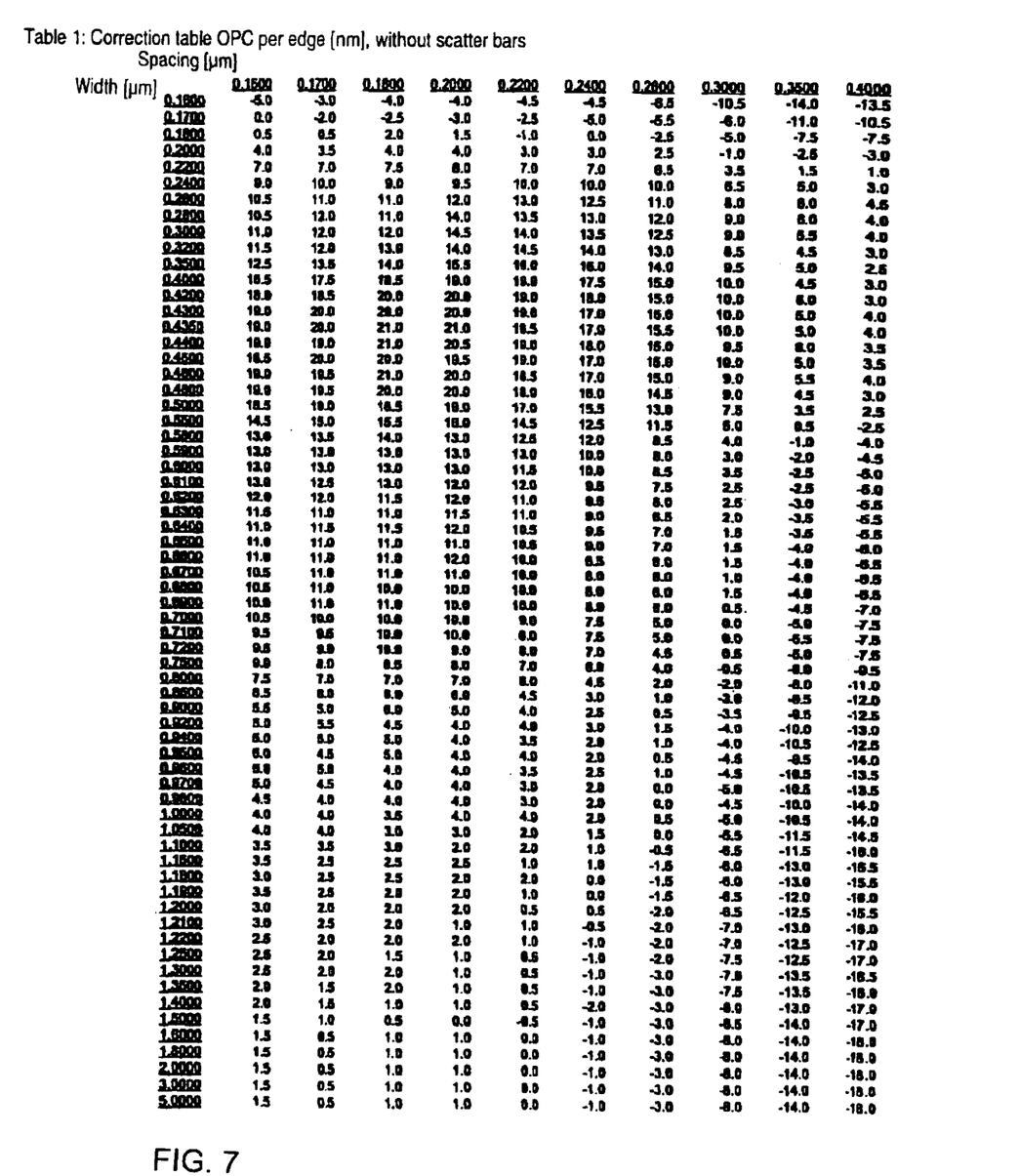
FIG. 7 is a table (table 1) listing correction values for OPC without scatter bars and without a proximity layer.

The smallest values for the second spacing and the width are 160 nm, because smaller structures do not occur here.

The correction value can now be read from the table with the aid of these two values. For instance, for a width FW of 200 nm and a second spacing FS of 400 nm, the correction value is 19.0. The correction values have been determined experimentally.

But the amount of the correction value is dependent on whether or not scatter bars are utilized. If scatter bars are utilized, the correction values partly change relative to Table 1.

Figure 8:
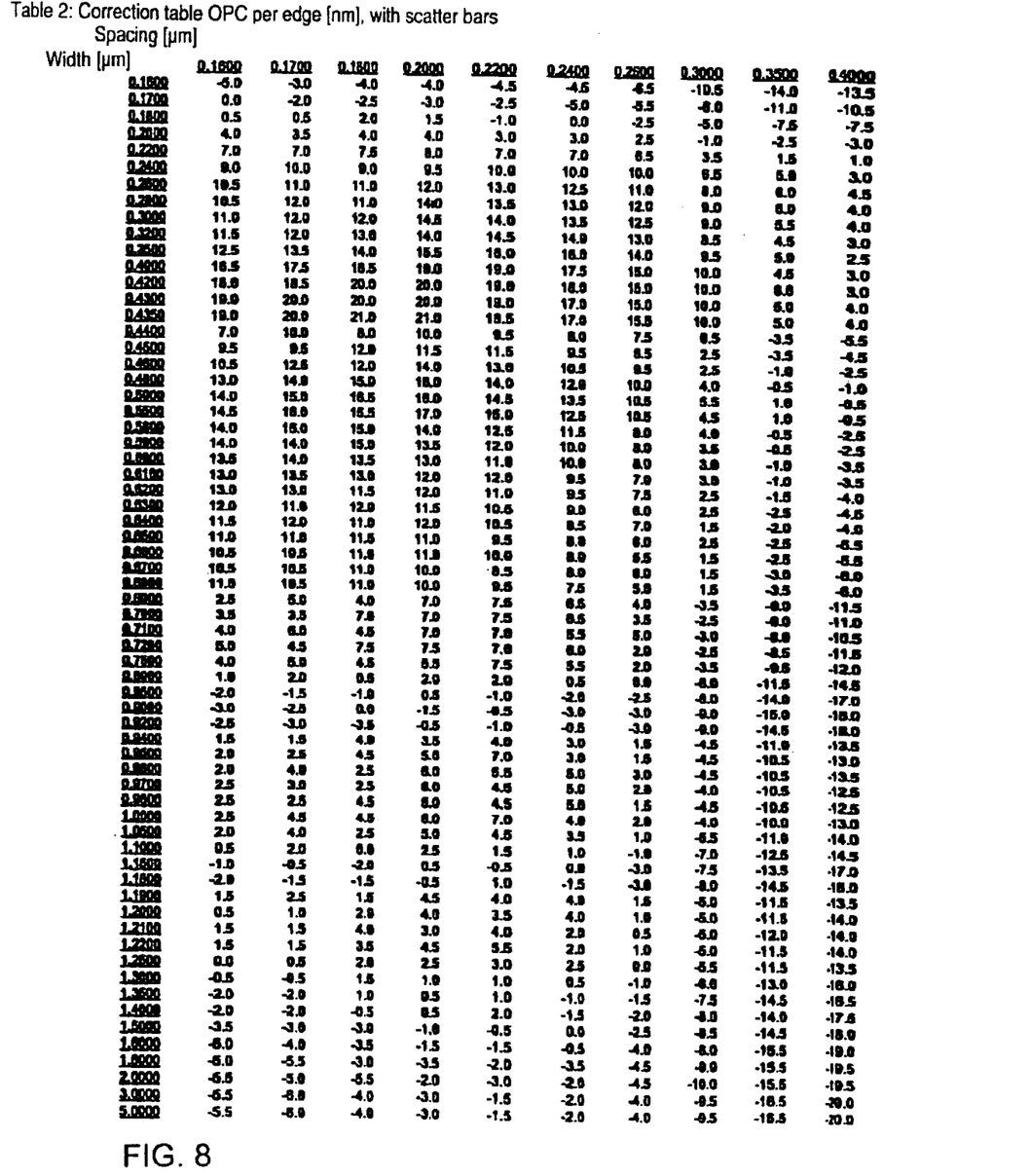
FIG. 8 is a table (table 2) listing correction values for OPC with scatter bars and without a proximity layer.

This is represented in Table 2 (FIG. 8). A comparison of Tables 1 and 2 reveals greater deviation in the correction values at the insertion points for one, two, or three scatter bars, i.e. at 440 nm, 690 nm, 940 nm (compare the specification of FIGS. 1A–1C). If all second spacings FS between parts of the main structure were provided with scatter bars according to the scatter bar generation rules (see FIG. 1), Table 2 could be used directly.

But in the scatter bar generation, scatter bars which are provided according to the rules must be removed again, because they intersect with other scatter bars, or because the spacing between them is too small. If these scatter bars were not removed, they would be imaged on the substrate in the exposure process in certain circumstances, which is undesirable. Scatter bars under a minimum length are also removed.

An OPC method must therefore recognize whether or not a scatter bar is actually present and then apply the corresponding correction table (Table 1 or Table 2).

Table 2 (which presumes that the scatter bars have been inserted according to the generation rules) would have to be modified so that it gives the distance to the next scatter bar, and not the distance to the next main structure. The correction values would then be specified depending on this. If no scatter bars are utilized, the correction values of Table 1 are utilized.

But the problem is that it is impossible to distinguish whether a distance to the nearest neighbor is the distance to a scatter bar or the distance to another part of the main structure. In particular, spacings between 170 nm and 295 nm can be distances between parts of the main structure or distances between a scatter bar and a part of the main structure. No correction value can be given for these spacings.

In the described development of the invention, the above-mentioned proximity layer is utilized for representing the position of auxiliary scatter bars. Auxiliary scatter bars are generated by virtually shifting the scatter bars or modifying their size. The position of the auxiliary scatter bars is formed so that an unambiguous discrimination between the main structure and the auxiliary scatter bars (and thus the scatter bars, these being represented by the auxiliary scatter bars) is possible. The auxiliary scatter bars are taken into consideration as a proximity layer in the OPC. However, the auxiliary scatter bars are no longer needed for the mask fabrication, and the "real" scatter bars are generated on the mask.

In order to make this discrimination possible, auxiliary scatter bars are arranged in the proximity layer next to the main structures with a purposefully smaller spacing. In a development of the invention, this is accomplished in that the auxiliary scatter bars are formed by purposeful expansion, i.e. broadening of the scatter bars. The distances between the auxiliary scatter bars thus become shorter than the real second spacings between parts of the main structures or parts thereof.

If the expansion instruction is selected such that the distance between the auxiliary scatter bar and the main structure is always shorter than the shortest distance between elements of the main structure, a distinction can be made on the basis of the spacings alone. In other words, the longest distance between main structure GC and all auxiliary scatter bars must always be shorter than all distances between parts of the main structure.

The distance of the auxiliary scatter bar, which is represented in the proximity layer, from the main structures thus represents an auxiliary quantity with the aid of which the type of spacing can be ascertained:

First Type: spacing main structure—(real) scatter bar

Second Type: spacing between parts of the main structure

Applied to the above example (Tables 1 and 2), this means that spacings smaller than 160 nm indicate a spacing to an auxiliary scatter bar, and thus the presence of a scatter bar; spacings greater than 160 nm signal a spacing to a part of the main structure. The inventively generated auxiliary quantity is thus less than 160 nm.

Figure 9A:
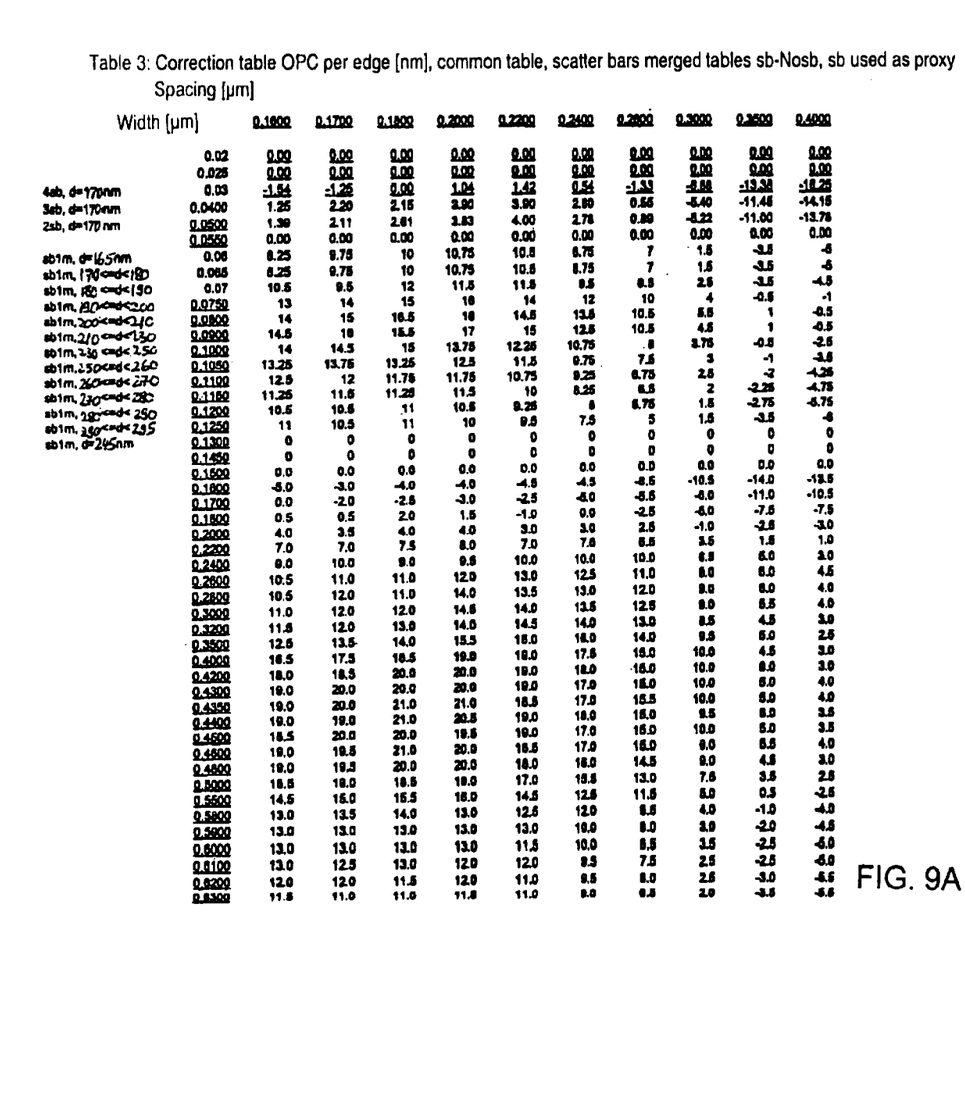
FIG. 9 is a table (table 3) listing correction values for the The method according to the invention with a threshold value of 160 nm for distinguishing correction values for intervals between auxiliary scatter bars and the main structure, from correction values for intervals between the main structure and the main structure.
Figure 9B:
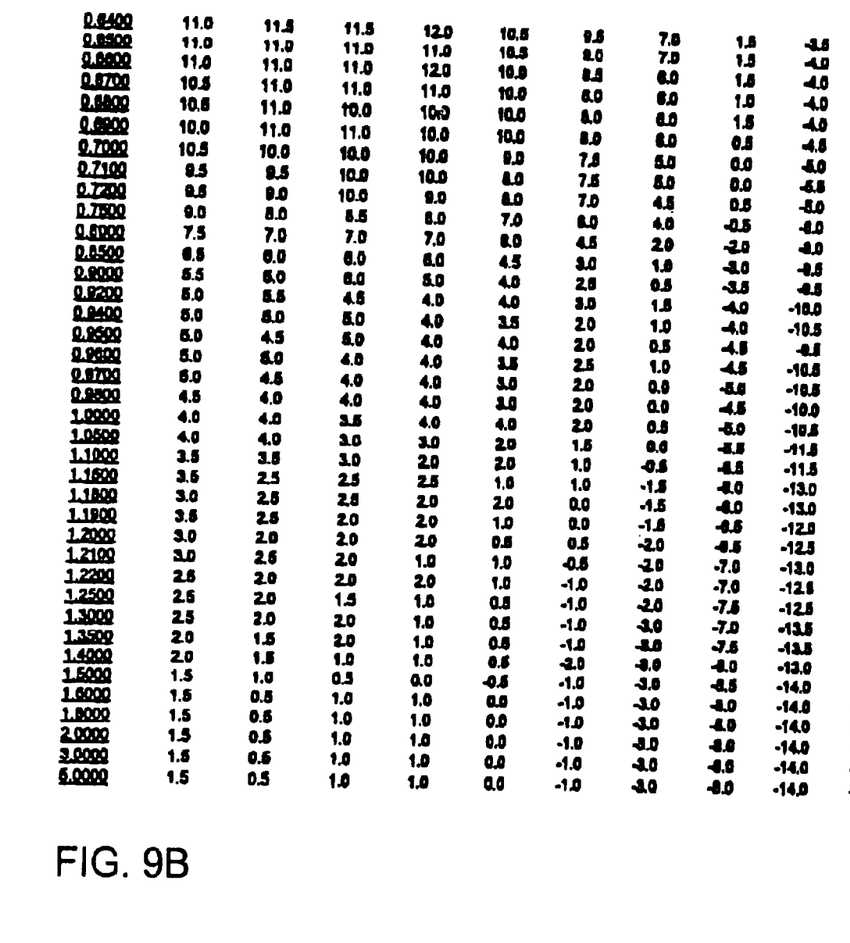

This is reflected in Table 3. For spacings larger than 160 nm, Table 3 corresponds to Table 1; i.e., the values relate to correction values without a scatter bar.

For spacings smaller than 160 nm, correction factors are given for the case with scatter bars. Thus, the functions of the separate Tables 1 and 2 merge into a single table. The program recognizes spacings and assigns correction values in dependence on the width (FW). It is irrelevant whether the value in the first column a real second spacing FS between parts of the main structure or a virtual spacing which is generated by the above described expansion of the scatter bar. [sic]

Figure 3:
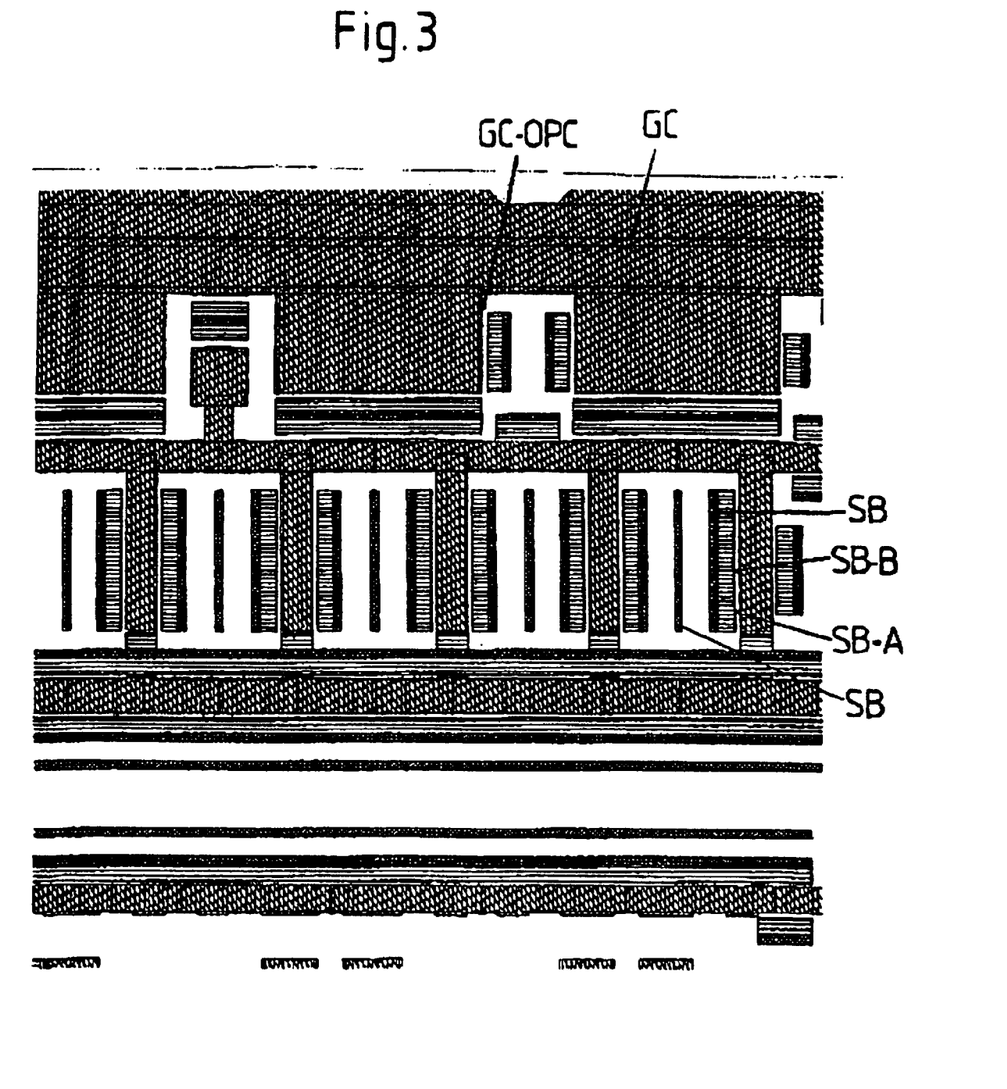
FIG. 3 is a section of a layout with scatter bars and two variants for generating a first spacing between auxiliary scatter bars and parts of the main structure.

FIG. 3 represents the application of two variants (A and B) of the inventive method with the aid of a layout section.

The main structures GC without an OPC are represented in light shading; the main structures GC with OPC (GC-OPC) are represented in dark. Because the OPC corrections are relatively small, they are represented more clearly in FIG. 5. The scatter bars as they should be written onto the mask are represented in light shading. Note regions of the main structure GC, between which one, two, three or four scatter bars are represented. In the first variant of the inventive method, the auxiliary scatter bars are formed by the virtual expanding of the scatter bars, so that the largest spacing between vd (the auxiliary quantity) is less than the smallest spacing FS between parts of the main structure. Thus:

$$\text{Max}(vd) < \text{Min}(FS)$$

Figure 5:
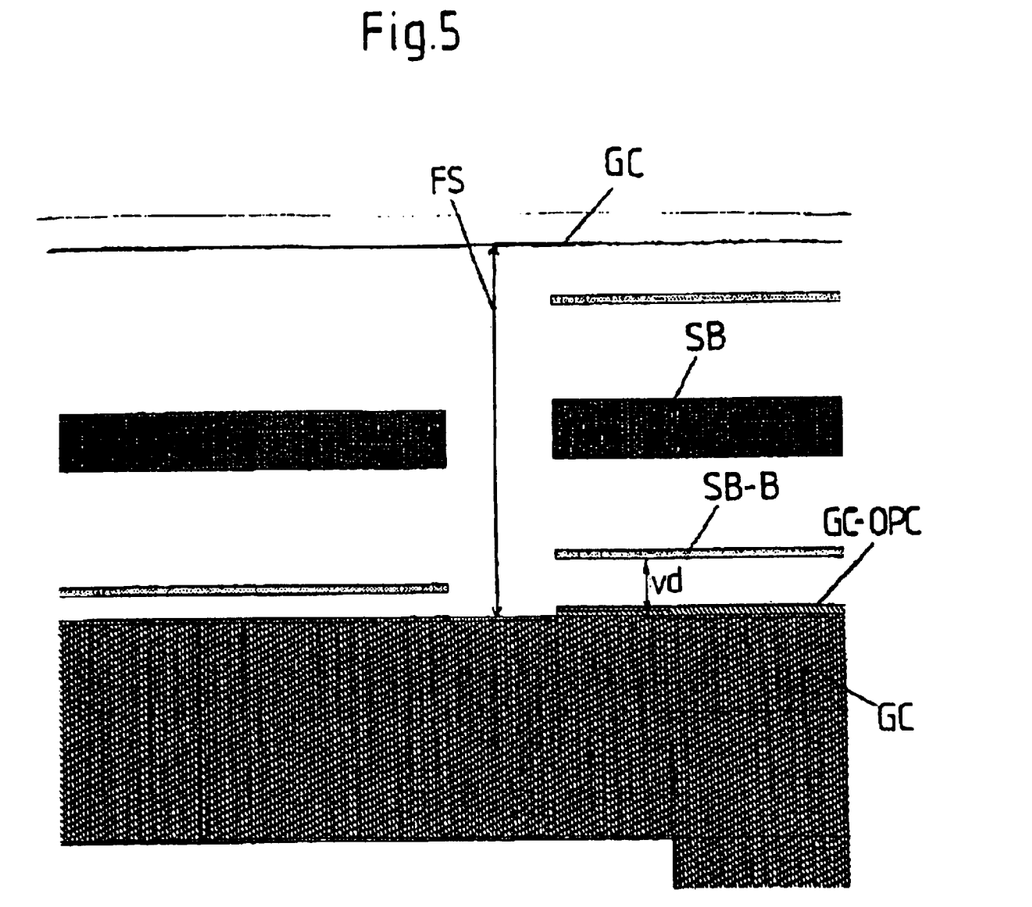
FIG. 5 is an enlarged partial section from FIG. 4.

FIG. 5 represents the virtual spacing vd and the spacing FC for purposes of illustration.

In FIG. 3 the auxiliary scatter bars are represented by black boxes SB-A with horizontal hatching. As mentioned above, the auxiliary scatter bars are represented in a separate layer (proximity layer).

In a second variant, the spacing vd between the auxiliary scatter bar sb and parts of the main structure GC is set by narrowing the scatter bar sb and shifting it by an adjustable offset in the direction of the main structure. In FIG. 3 the auxiliary scatter bar is represented by the shaded line SB-B.

Even if the two variants are represented here as alternatives, on principle it is possible to utilize both variants for one layout in parallel fashion.

Figure 4:
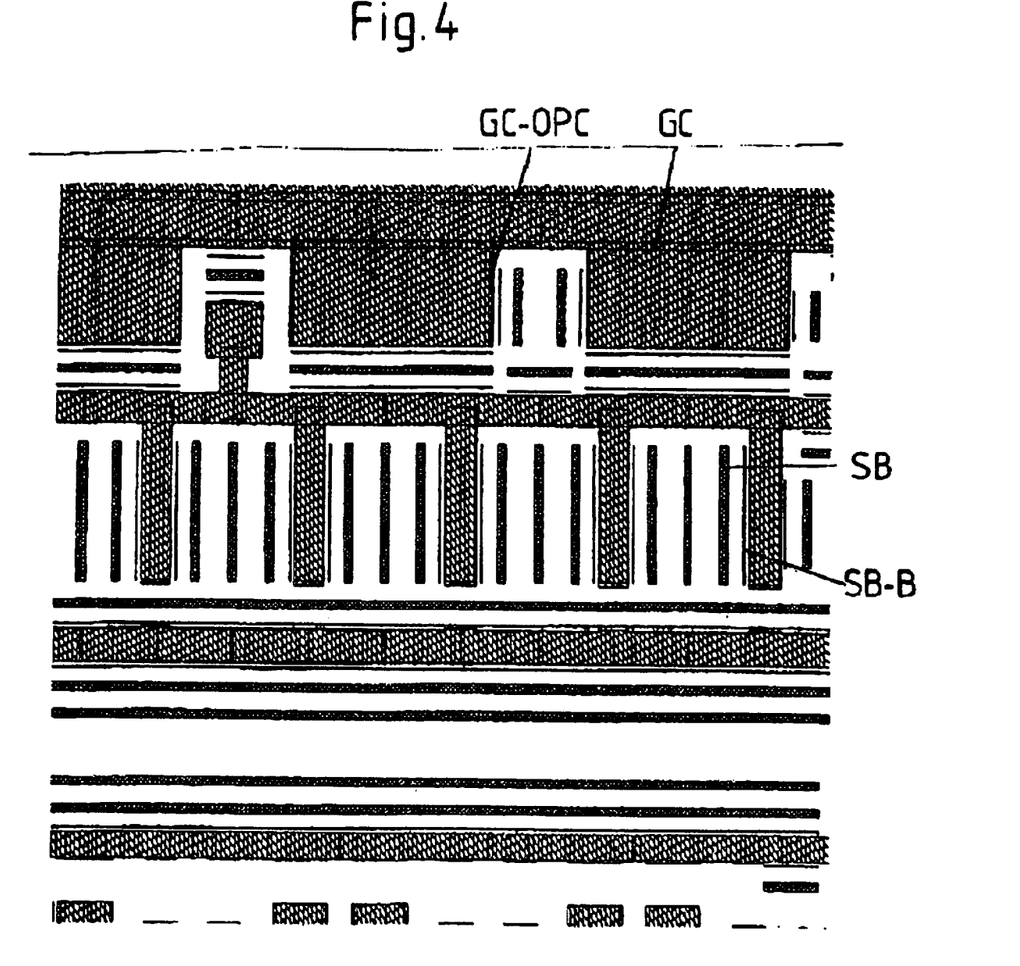
FIG. 4 is a section of a layout as represented in FIG. 3, but with only the second variant for generating a first spacing between auxiliary scatter bars and parts of the main structure.

The second variant is represented more clearly in FIG. 4, the first variant having been omitted for reasons of clarity. The reference characters are identical to FIG. 3, so that the above description may be consulted.

FIG. 5 represents, in an enlargement of a detail of FIG. 4, how the OPC acts on the main structure GC. The main structure GC is shown with light shading; the main structure with OPC (GC-OPC) is dark. The auxiliary scatter bars (SB-B) have been generated with the second variant, i.e. with offsets.

Figure 6:
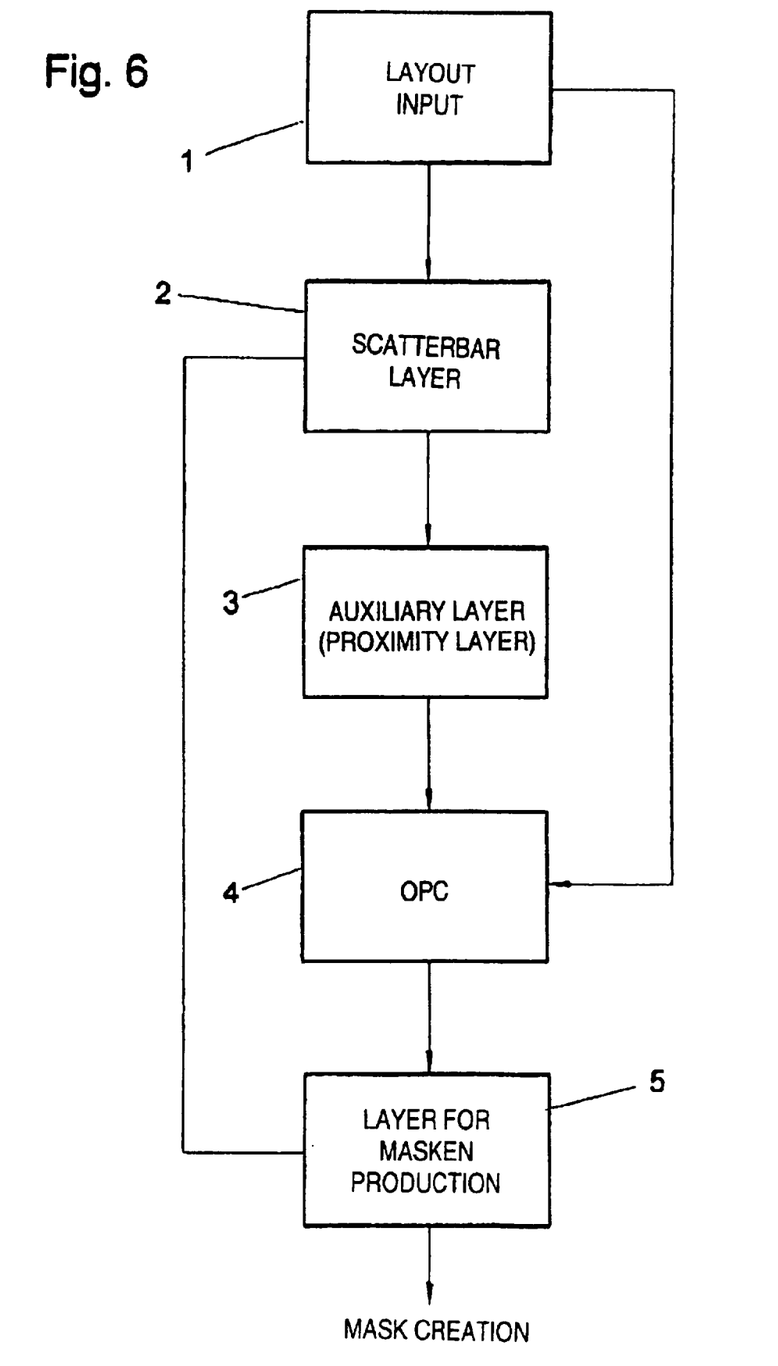
FIG. 6 is a flowchart of a mask structure generation.

FIG. 6 is a diagram representing the sequence of steps in the generation of the structure of a mask. The steps 2–5 in FIG. 6 are carried out by a data processing system.

In a first step 1, the layout of the microelectronic element that is to be fabricated is inputted into the data processing system by entering predetermined parameters. The layout contains all structures which will be generated on a substrate and their dimensions.

Based on the layout, scatter bars are computed in a second step 2. The corresponding data set is referenced scatter bar layer 2 in FIG. 6 and contains positions and dimensions of the scatter bars. Note that scatter bars can be specified by entering corresponding parameters in the layout generation as well as by automatic computer generation.

In a third step 3, the positions and dimensions of auxiliary scatter bars are calculated from the data of the scatter bar layer. The data representing the auxiliary scatter bars form a data set, referred to as an auxiliary layer, which inventively forms the proximity layer.

In a fourth step 4, an OPC is carried out with the aid of the data describing the layout and the data of the auxiliary layer. That is, instead of data describing the actual positions and dimensions of the scatter bars, auxiliary data are used, which describe the positions and dimensions of "virtual" auxiliary scatter bars. The effect of this approach has been described above.

In a fifth step 5, the data generated in step 4 are combined with those of the scatter bar layer. This produces an additional layer, which contains all the information necessary for writing the mask (i.e. the positions and sizes of the main structures and scatter bars). Following the reading of these data, the mask fabrication process can be carried out.

It will be understood that the invention is not limited to the described exemplifying embodiments but rather comprises modifications within the scope defined by the claims.

I claim:

1. A method for the lithographic fabrication of a microelectronic component with optical proximity correction, which comprises:

imaging a main structure with an auxiliary structure onto a substrate by exposing;

selecting at least one correction value for an optical proximity correction in dependence upon a spacing between two parts of the main structure or a spacing between neighboring main structures and a presence of the auxiliary structure between the two parts of the main structure or between neighboring main structures;

forming an auxiliary quantity for the auxiliary structure for the purpose of determining a manner wherein the correction value is specified, and thereby setting a largest auxiliary quantity to be smaller than a smallest spacing between the parts of the main structure;

concluding with a program for the optical proximity correction whether the auxiliary structure is present between two parts of the main structure ox between neighboring main structures; and setting the auxiliary quantity in a proximity layer.

2. The method according to claim 1, which comprises applying the main structure and the auxiliary structure on a mask for a subsequent imaging of the main structure from the mask onto the substrate.

3. The method according to claim 2, wherein setting the auxiliary quantity is a virtual modification in a layer that is separate from a layer utilized for fabricating the mask.

4. The method according to claim 1, which comprises forming the auxiliary structure with at least one scatter bar.

5. The method according to claim 4, which comprises setting the auxiliary quantity by a virtual expansion or reduction of at least one scatter bar.

6. The method according to claim 4, which comprises setting the auxiliary quantity by a virtual offset from a real position of at least one scatter bar.

7. The method according to claim 4, which comprises storing the OPC correction values of a first region of a layout with scatter bars and a second region of a layout without scatter bars in a single table for use in a program.

8. The method according to claim 7, which comprises utilizing an amount of the largest auxiliary quantity as a criterion for discriminating between the first and second regions.

9. The method according to claim 4, which comprises defining at least one scatter bar with a rectangular shape having a predetermined width and extending parallel to a part of the main structure.

10. The method according to claim 4, which comprises defining at least one scatter bar with a polygonal shape having an adjustable width, and arranging the polygonal shape parallel to a part of the main structure.

11. The method according to claim 1, which comprises exposing with radiation selected from the group consisting of UV light, X-radiation, laser radiation, and particle radiation.

12. The method according to claim 1, wherein the optical proximity correction is an OPC selected from the group consisting of line-bias based OPC, hammerhead based OPC, and serif based OPC.

13. The method according to claim 5, which comprises setting the auxiliary quantity by a virtual offset from a real position of at least one scatter bar.

14. A method for the lithographic fabrication of a microelectronic component with optical proximity correction, which comprises:

imaging a main structure with an auxiliary structure onto a substrate by exposing;

selecting at least one correction value for an optical proximity correction in dependence upon a spacing between two parts of the main structure and a presence of the auxiliary structure between the two parts of the main structure;

forming an auxiliary quantity for the auxiliary structure for the purpose of determining a manner wherein the correction value is specified, and thereby setting a largest auxiliary quantity to be smaller than a smallest spacing between the parts of the main structure;

concluding with a program for the optical proximity correction whether the auxiliary structure is present between two parts of the main structure; and storing the OPC correction values of a first region of a layout with scatter bars and a second region of a layout without scatter bars in a single table for use in a program.

15. The method according to claim 14, which comprises applying the main structure and the auxiliary structure on a mask for a subsequent imaging of the main structure from the mask onto the substrate.

16. The method according to claim 15, wherein setting the auxiliary quantity is a virtual modification in a layer that is separate from a layer utilized for fabricating the mask.

17. The method according to claim 14, which comprises forming the auxiliary structure with at least one scatter bar.

18. The method according to claim 17, which comprises setting the auxiliary quantity by a virtual expansion or reduction of at least one scatter bar.

19. The method according to claim 17, which comprises setting the auxiliary quantity by a virtual offset from a real position of at least one scatter bar.

20. The method according to claim 14, which comprises setting the auxiliary quantity in a proximity layer.

21. The method according to claim 14, which comprises utilizing an amount of the largest auxiliary quantity as a criterion for discriminating between the first and second regions.

22. The method according to claim 17, which comprises defining at least one scatter bar with a rectangular shape having a predetermined width and extending parallel to a part of the main structure.

23. The method according to claim 17, which comprises defining at least one scatter bar with a polygonal shape having an adjustable width, and arranging the polygonal shape parallel to a part of the main structure.

24. The method according to claim 14, which comprises exposing with radiation selected from the group consisting of UV light, X-radiation, laser radiation, and particle radiation.

25. The method according to claim 14, wherein the optical proximity correction is an OPC selected from the group consisting of line-bias based OPC, hammerhead based OPC, and serif based OPC.

* * * * *